(12) United States Patent
Chen et al.

(10) Patent No.: US 9,378,998 B2
(45) Date of Patent: Jun. 28, 2016

(54) SEMICONDUCTOR STRUCTURE AND METHOD OF FORMING A HARMONIC-EFFECT-SUPPRESSION STRUCTURE

(71) Applicant: UNITED MICROELECTRONICS CORP., Hsin-Chu (TW)

(72) Inventors: Tong-Yu Chen, Hsinchu (TW); Kuo-Yuh Yang, Hsinchu County (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/686,784

(22) Filed: Apr. 15, 2015

(65) Prior Publication Data

US 2015/0221543 A1   Aug. 6, 2015

Related U.S. Application Data

(62) Division of application No. 13/932,009, filed on Jul. 1, 2013, now Pat. No. 9,048,285.

(51) Int. Cl.

| H01L 21/76 | (2006.01) |
|---|---|
| H01L 21/762 | (2006.01) |
| H01L 29/06 | (2006.01) |
| H01L 21/02 | (2006.01) |
| H01L 21/265 | (2006.01) |
| H01L 21/306 | (2006.01) |
| H01L 21/308 | (2006.01) |
| H01L 21/768 | (2006.01) |

(52) U.S. Cl.
CPC .... *H01L 21/76224* (2013.01); *H01L 21/02532* (2013.01); *H01L 21/02595* (2013.01); *H01L 21/02664* (2013.01); *H01L 21/26506* (2013.01); *H01L 21/3081* (2013.01); *H01L 21/30604* (2013.01); *H01L 21/30625* (2013.01); *H01L 21/76232* (2013.01); *H01L 21/76283* (2013.01); *H01L 29/0649* (2013.01); *H01L 21/7624* (2013.01); *H01L 21/76898* (2013.01)

(58) Field of Classification Search
CPC .................................................. H01L 21/76286
USPC .......................................... 438/282, 440, 950
See application file for complete search history.

(56) References Cited

U.S. PATENT DOCUMENTS

| 7,804,151 | B2 | 9/2010 | Brown | |
|---|---|---|---|---|
| 7,999,320 | B2* | 8/2011 | Botula | H01L 21/76224 257/347 |
| 8,003,488 | B2* | 8/2011 | Cheng | H01L 21/84 438/430 |
| 8,299,537 | B2 | 10/2012 | Greco | |
| 2013/0134491 | A1 | 5/2013 | Messenger | |

OTHER PUBLICATIONS

Wikipedia, Amorphous silicon, Nov. 8, 2011, http://web.archive.org/web/20111108045939/http://en.wikipedia.org/wiki/Amorphous_silicon.

* cited by examiner

*Primary Examiner* — Chandra Chaudhari
(74) *Attorney, Agent, or Firm* — Winston Hsu; Scott Margo

(57) ABSTRACT

A method of forming a harmonic-effect-suppression structure is disclosed. The method includes: providing a semiconductor substrate having a base semiconductor substrate, a buried dielectric on the base semiconductor substrate, and a surface semiconductor layer on the buried dielectric. Next, a deep trench is formed extending through the surface semiconductor layer and the buried dielectric into the base semiconductor substrate, a silicon layer is formed within a lower portion of the deep trench, the silicon layer allowed to have a top surface height substantially the same as or lower than a top surface height of the base semiconductor substrate, and a dielectric layer is formed within the deep trench and on the silicon layer.

18 Claims, 6 Drawing Sheets

US 9,378,998 B2

SEMICONDUCTOR STRUCTURE AND METHOD OF FORMING A HARMONIC-EFFECT-SUPPRESSION STRUCTURE

CROSS REFERENCE TO RELATED APPLICATIONS

This application is a division of U.S. application Ser. No. 13/932,009 filed Jul. 1, 2013, and incorporated herein by reference in its entirety.

BACKGROUND OF THE INVENTION

1. Field of the Invention

The present invention relates to a semiconductor technology, and particularly to a technology for harmonic effect suppression in a semiconductor structure.

2. Description of the Prior Art

In radio frequency (RF) integrated circuit application, such as RF switch device or power amplifier device, performance is suffered from "parasitic surface charge" issue, which in turn generates harmonic effect. There are several wafer process technologies available for solving the issue such as using semiconductor-on-insulator (SOI) wafer to isolate the charges from the high resistivity wafer substrate. However, as the RF switch goes high frequency, it is more sensitive to RF harmonic effect induced by the parasitic surface charges. The problem needs to be solved.

SUMMARY OF THE INVENTION

One objective of the present invention is to provide a semiconductor structure and a method of forming a harmonic-effect-suppression structure, in which harmonic effect due to RF device commonly encountered by such structure can be suppressed.

In an aspect, a semiconductor structure according to an embodiment of the present invention includes a semiconductor substrate, a device, a deep trench, a silicon layer, and a dielectric layer. The semiconductor substrate includes a base semiconductor substrate, a buried dielectric on the base semiconductor substrate, a surface semiconductor layer on the buried dielectric, and a shallow trench isolation (STI) layer within the surface semiconductor layer. The device is disposed on the surface semiconductor layer. The deep trench is adjacent to the device and extends through the shallow trench isolation layer and the buried dielectric and into the base semiconductor substrate. The silicon layer is disposed within a lower portion of the deep trench. The silicon layer has a height at a level substantially the same as or lower than that of a top surface of the base semiconductor substrate. The dielectric layer is disposed within the deep trench and on the silicon layer.

In another aspect, a method of forming a harmonic-effect-suppression structure according to another embodiment of the present invention includes steps as follows. A semiconductor substrate is provided. The semiconductor substrate includes a base semiconductor substrate, a buried dielectric on the base semiconductor substrate, and a surface semiconductor layer on the buried dielectric. A deep trench is formed so as to extend through the surface semiconductor layer and the buried dielectric and into the base semiconductor substrate. A silicon layer is formed within a lower portion of the deep trench. The silicon layer is allowed to have a height at a level substantially the same as or lower than that of a top surface of the base semiconductor substrate. A dielectric layer is formed within the deep trench and on the silicon layer.

In further another aspect, the method of forming a harmonic-effect-suppression structure according to further another embodiment of the present invention includes steps as follows. A semiconductor substrate and a device are provided. The device is formed on or in the semiconductor substrate. The semiconductor substrate includes a base semiconductor substrate, a buried dielectric on the base semiconductor substrate, a surface semiconductor layer on the buried dielectric, and a shallow trench isolation layer in the surface semiconductor layer. An interlayer dielectric is formed so as to cover the semiconductor substrate. A deep trench is formed to be adjacent to the device and extends through the interlayer dielectric, the shallow trench isolation layer and the buried dielectric and into the base semiconductor substrate. The deep trench is aligned to the shallow trench isolation layer. A silicon layer is formed within a lower portion of the deep trench. The silicon layer is allowed to have a height at a level substantially the same as or lower than that of a top surface of the base semiconductor substrate. A dielectric layer is formed on the silicon layer within the deep trench. The dielectric layer is in contact with the silicon layer and a portion of the base semiconductor substrate.

In the present invention, the silicon layer can function as a charge release layer or a trap layer to freeze charges generated at the interface of the buried dielectric and the base semiconductor substrate. In other words, the charges can be attracted or trapped by the silicon layer to become electrically neutralized, so as to alleviate the parasitic surface charge issue existing at the interface between the buried dielectric and the base semiconductor substrate and suppress the harmonic effect generated due to existence of RF device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
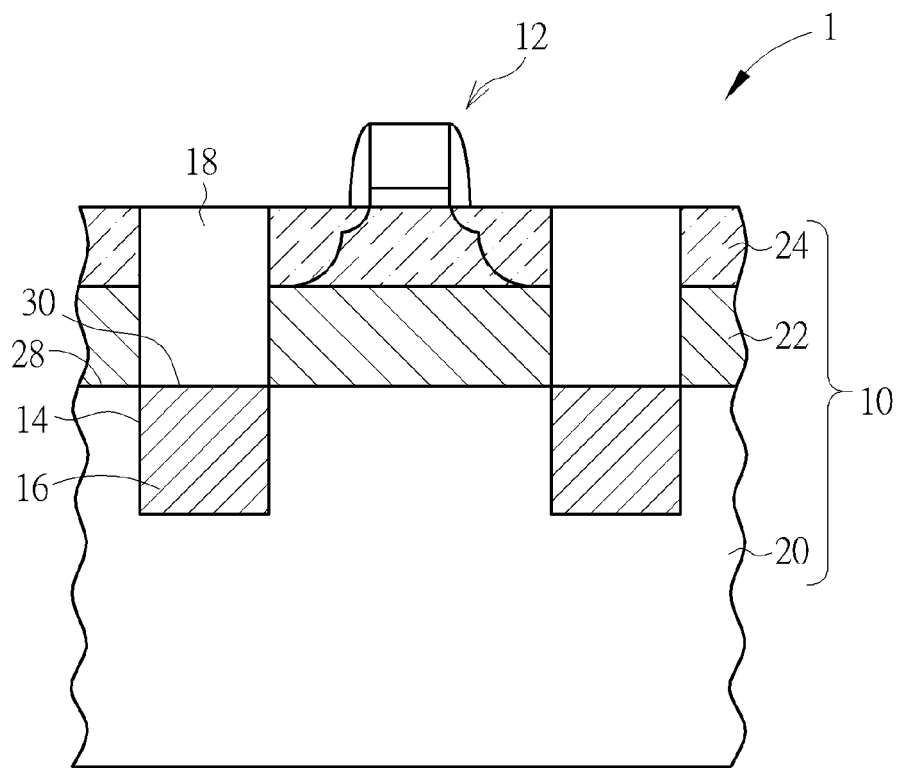
FIGS. 1 to 5 are cross-sectional views illustrating some semiconductor structures according to some embodiments of the present invention, respectively.

FIGS. 1 to 5 are cross-sectional views illustrating some semiconductor structures of some embodiments according to some aspects of the present invention. Referring to FIG. 1, the semiconductor structure 1 according to an embodiment of the present invention includes a semiconductor substrate 10, a device 12, a deep trench 14, a silicon layer 16 and a dielectric layer 18. The semiconductor substrate 10 includes a base semiconductor substrate 20, a buried dielectric 22 disposed on the base semiconductor substrate 20, a surface semiconductor layer 24 disposed on the buried dielectric 22, and a shallow trench isolation layer 26 disposed in the surface semiconductor layer 24. The base semiconductor substrate 20 may include, for example, a silicon material of high resistivity, such as an amorphous silicon layer, or a silicon substrate including SiGe layer, but not limited thereto. The buried dielectric 22 may include, for example, oxide layer. The buried oxide in this technical field may be referred to as BOX. The surface semiconductor layer 24 may include for example silicon. The surface semiconductor layer 24 is disposed on the buried dielectric 22, and this forms the type of structure of semiconductor-on-insulator (SOI) in the technical field.

Figure 2:
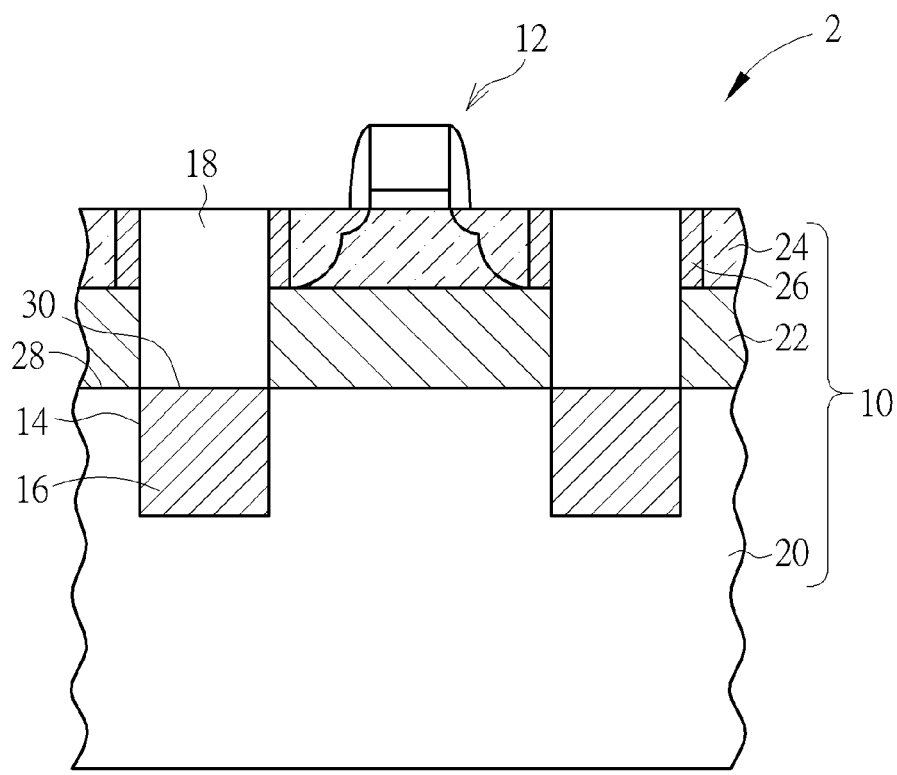

The device 12 may be for example a metal-oxide-semiconductor (MOS) field-effect transistor for forming for example an RF device. The device 12 may be disposed on the surface semiconductor layer 24. The MOS field-effect transistor may include a gate structure, a gate dielectric, a spacer, source/drain regions, and source/drain extension regions as a conventional one. The deep trench 14 is adjacent to the device 12 and extends through the shallow trench isolation layer 26 and the buried dielectric 22 into the base semiconductor substrate 20. The silicon layer 16 is disposed within a lower portion of the deep trench 14. The silicon layer 16 has a height at a level substantially the same as or lower than that of a top surface 28 of the base semiconductor substrate 20. In other words, the top surface 30 of the silicon layer 16 and the top surface 28 of the base semiconductor substrate 20 are located at a same level or the top surface 30 is lower than the top surface 28. The dielectric layer 18 is disposed on the silicon layer 16 within the deep trench 14. The shallow trench isolation layer 26 can electrically isolate an active area formed of the surface semiconductor layer 24 from other elements. The shallow trench isolation layer 26 is usually formed before the device 12 is formed. The deep trench 14 is formed after the shallow trench isolation layer 26 is formed. The deep trench 14 passes through the shallow trench isolation layer 26, and this forms the structure as shown in FIG. 1, but it is not limited thereto. In other aspect, the deep trench 14 is allowed to pass through the shallow trench isolation layer 26 and have a sidewall which also serves as a sidewall of the shallow trench isolation layer 26, or the deep trench 14 is allowed to have a trench width greater that the width of the shallow trench isolation layer 26, giving the semiconductor structure 2 as shown in FIG. 2, in which the structure of the shallow trench isolation layer 26 may be not shown. Or, the shallow trench isolation layer may be not formed in advance; yet after the deep trench 14 is formed, the dielectric layer 18 is filled the deep trench 14 for also serving for electric isolation as a shallow trench isolation layer.

Figure 3:
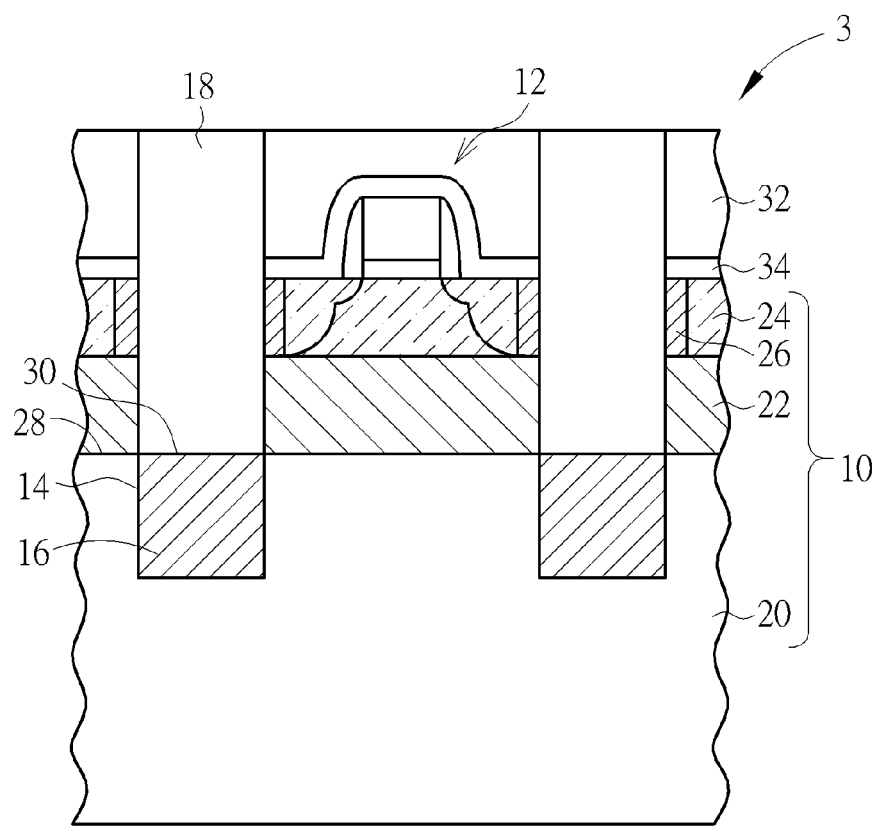

FIG. 3 shows a semiconductor structure 3 according to other aspect of the present invention, in which the deep trench 14 is formed after an interlayer dielectric 32 covers the device 12. Accordingly, the deep trench 14 passes through the interlayer dielectric 32, the shallow trench isolation layer 26, and the buried dielectric 22 and into the base semiconductor substrate 20. As desired, a contact etch stop layer (CESL) 34 may be formed to cover the device 12 and the semiconductor substrate 10 before the interlayer dielectric 32 is formed. In such aspect that the interlayer dielectric 32 is formed before the deep trench 14 is formed, the deep trench 14 then is allowed to pass through the shallow trench isolation layer 26 as shown in FIG. 2 to have a sidewall which is also a sidewall of the shallow trench isolation layer 26 or to have a trench width greater than the width of the shallow trench isolation layer 26. Or, the shallow trench isolation layer may be not formed in advance; yet after the deep trench 14 is formed, the dielectric layer 18 is filled the deep trench 14 for also serving for electric isolation as a shallow trench isolation layer. Accordingly, the dielectric layer 18 may include dielectric material suitably used for a shallow trench isolation.

Figure 4:
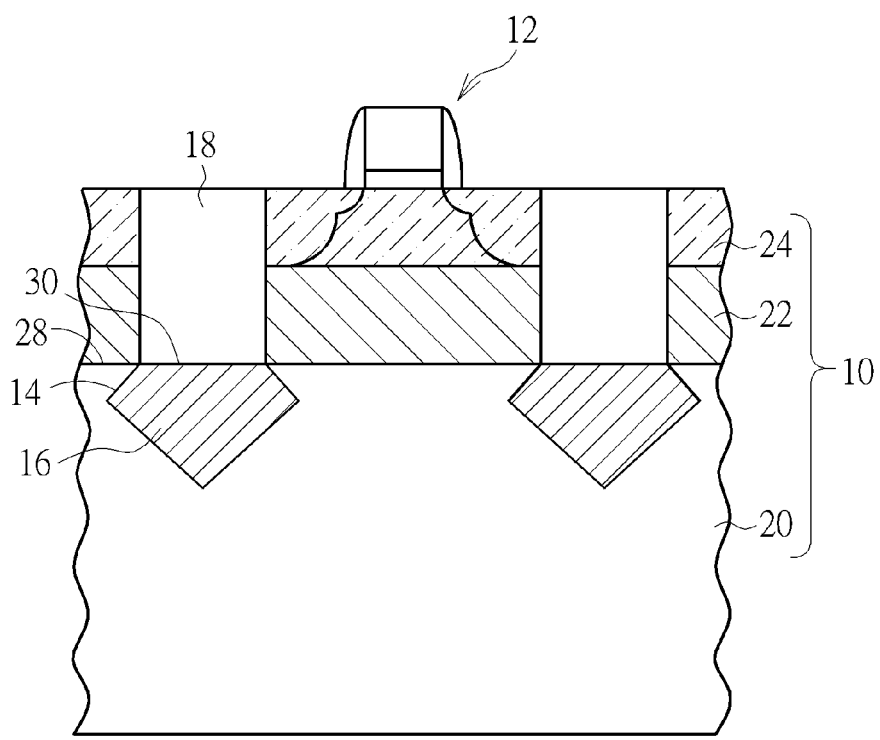
Figure 5:
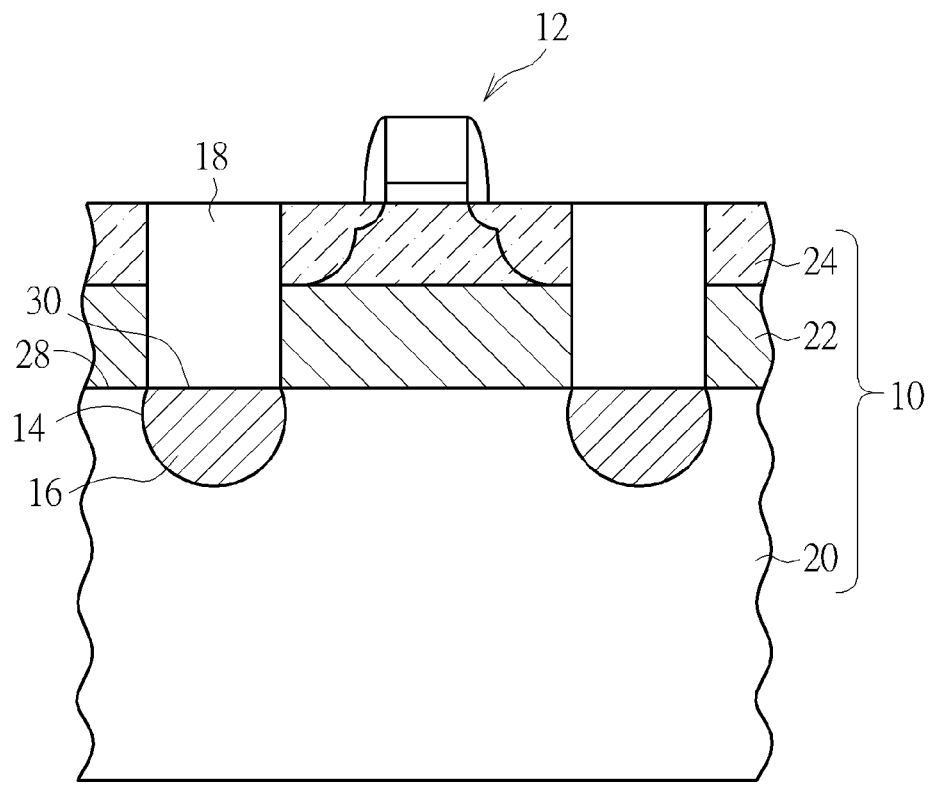

In the semiconductor structures 1, 2 and 3 shown in FIGS. 1 to 3, the lower portion of each deep trench 14 has an included angle formed by the sidewall and the bottom of the deep trench. Each deep trench 14 in these embodiments has a substantially continuous sidewall, but the present invention is not limited thereto and the deep trench may be in other shape. For example, as shown in FIG. 4, the lower portion of the deep trench 14 is a portion located within the base semiconductor substrate 20 and has a shape of polygon in a cross-sectional view. Still for example, as shown in FIG. 5, the lower portion of the deep trench 14 is a portion located within the base semiconductor substrate 20 and has a shape of bowl in a cross-sectional view.

It is noted that in the semiconductor structures as described above, the silicon layer 16 may include ion-implanted polysilicon, un-ion-implanted polysilicon, ion-implanted amorphous silicon or un-ion-implanted amorphous silicon. It is preferred that the silicon layer 16 includes ion-implanted amorphous silicon, so as to have more charge trapped areas. In one situation, when the semiconductor structure according to the present invention is applied to an RF switch device, a metal layer, such as a metal interconnect, disposed above the interlayer dielectric on the semiconductor structure tends to generate electromagnetic wave due to RF. The electromagnetic wave induces the BOX/the base semiconductor substrate to produce charges, a type of free charge. The silicon layer disposed within the deep trench can capture these charges.

Figure 6:
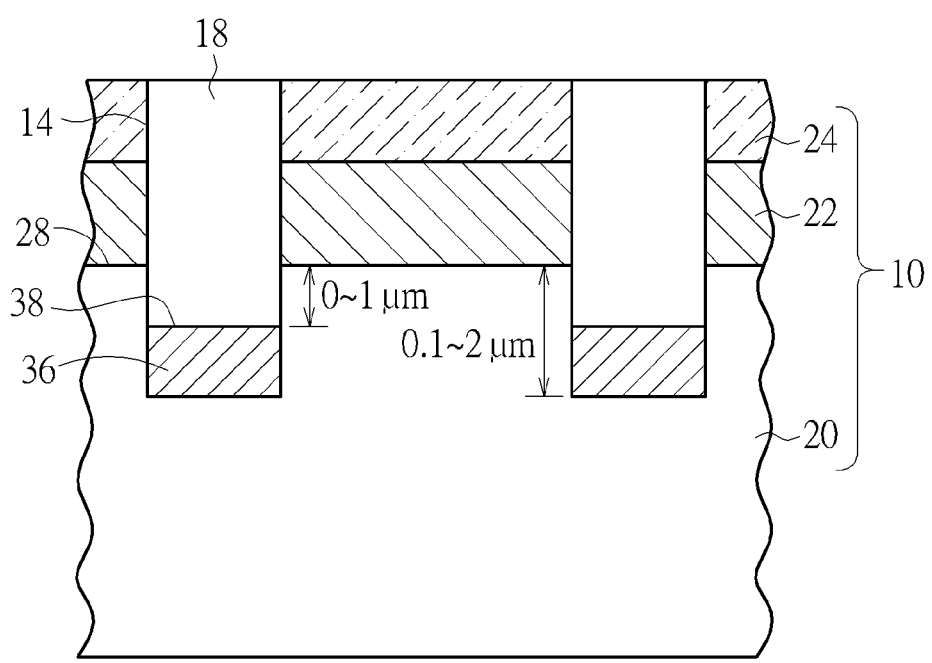
FIG. 6 is a cross-sectional view illustrating a shape of a silicon layer of a semiconductor structure according to another embodiment of the present invention.

In further another aspect of the present invention, as shown in FIG. 6, in the semiconductor structure, the silicon layer 36 has a height at a level lower than the top surface 28 of the base semiconductor substrate 20. In other words, the top surface 38 of the silicon layer 36 is lower than the top surface 28 of the base semiconductor substrate 20. In one embodiment of the present invention, it is preferred that the bottom of the deep trench is lower than the top surface of the base semiconductor substrate about 0.1 to 2 μm, and the top surface of the silicon layer can be at the same level of the top surface of the base semiconductor substrate or lower than the top surface of base semiconductor substrate. Preferably, the top surface of the silicon layer may be lower than the top surface of the base semiconductor substrate about 0 to 1 μm. "0" means at the same level. In other words, the bottom portion of the dielectric layer 18 may be recessed or not recessed into the base semiconductor substrate 20. In other preferred situation, the silicon layer has a thickness greater or equal to a half of the distance from the bottom of the deep trench to the top surface of the base semiconductor substrate.

Figure 7:
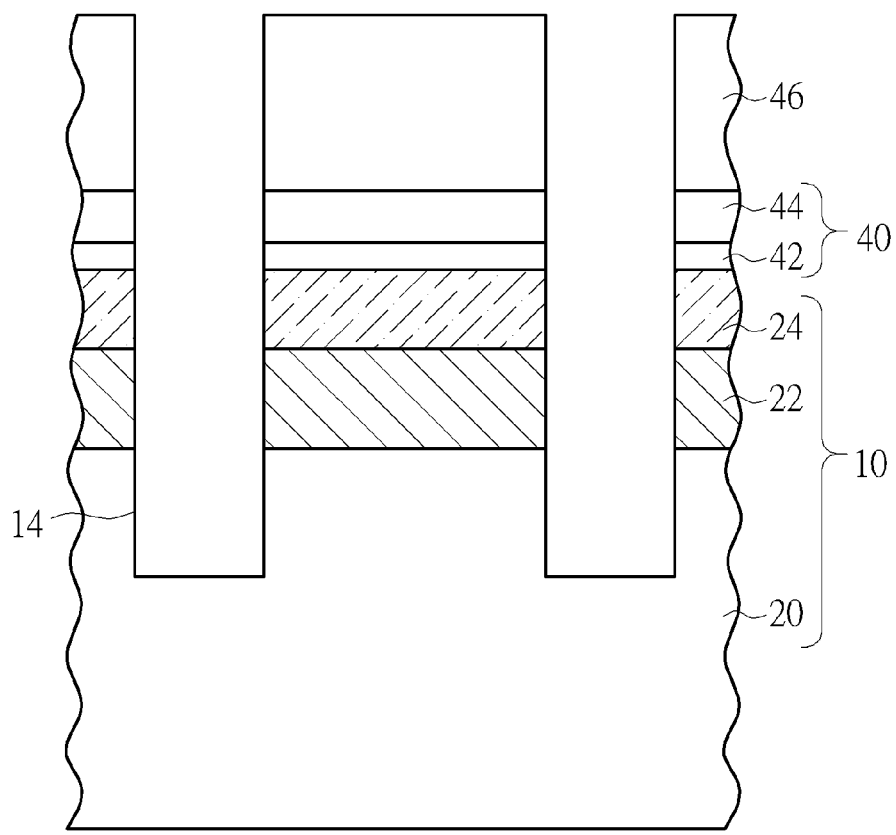
FIGS. 7 to 9 are cross-sectional views illustrating a method of forming a structure having harmonic effect suppression properties according to one embodiment of the present invention.

A method of forming a harmonic-effect-suppression structure according to one embodiment of the present invention is described as follows. Please refer to FIGS. 7 to 9. As shown in FIG. 7, first, a semiconductor substrate 10 is provided. The semiconductor substrate 10 includes a base semiconductor substrate 20, a buried dielectric 22 disposed on the base semiconductor substrate 20, a surface semiconductor layer 24 disposed on the buried dielectric 22. Next, a deep trench 14 is formed. The deep trench 14 is allowed to extend through the surface semiconductor layer 24 and the buried dielectric 22 and into the base semiconductor substrate 20. The deep trench 14 may be formed including steps as follows. For example, a hard mask 40 is formed on the surface semiconductor layer 24, and the semiconductor substrate 10 is etched through the hard mask 40. The surface semiconductor layer 24 and the buried dielectric 22 are etched through and a portion of the base semiconductor substrate 20 is removed to form the deep trench 14. The hard mask 40 may include for example a pad oxide 42 and a pad silicon nitride 44. The hard mask 40 may be patterned by an etch process performed through a patterned photoresist layer 46 formed on the hard mask 40.

Figure 8:
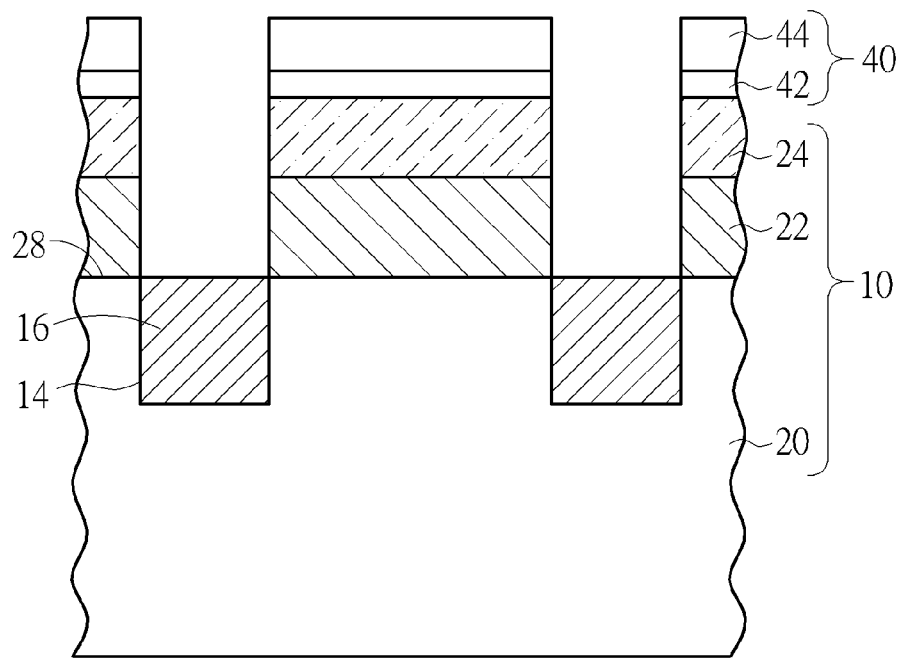

Thereafter, as shown in FIG. 8, the patterned photoresist layer 46 may be removed, followed by forming the silicon layer 16 in the lower portion of the deep trench 14. The silicon layer 16 may be formed using, for example, a blanket deposition process to deposit a silicon layer within the deep trench 14 to fully fill the deep trench 14. The silicon layer may extend onto the pad silicon nitride 44. Thereafter, a planarization process, such as a chemical-mechanical polishing (CMP) process is performed and stops at the hard mask 40, i.e. stops at the pad silicon nitride 44, by virtue of low removing rate of the pad silicon nitride 44 in the CMP process, to render the silicon layer a planar surface. Thereafter, the silicon layer is etched back through the hard mask 40, resulting in the silicon layer 16. The etched-back silicon layer 16 has a height substantially the same as or lower than the top surface 28 of the base semiconductor substrate 20. Alternatively, the silicon layer 16 having a desired height may be obtained directly by the etch back process without performing the CMP process.

The silicon layer as described above may be formed using, for example, a low pressure chemical vapor deposition (LPCVD) process to form polysilicon material, or an LPCVD at a lower temperature for example 500° C. to form amorphous silicon.

Figure 9:
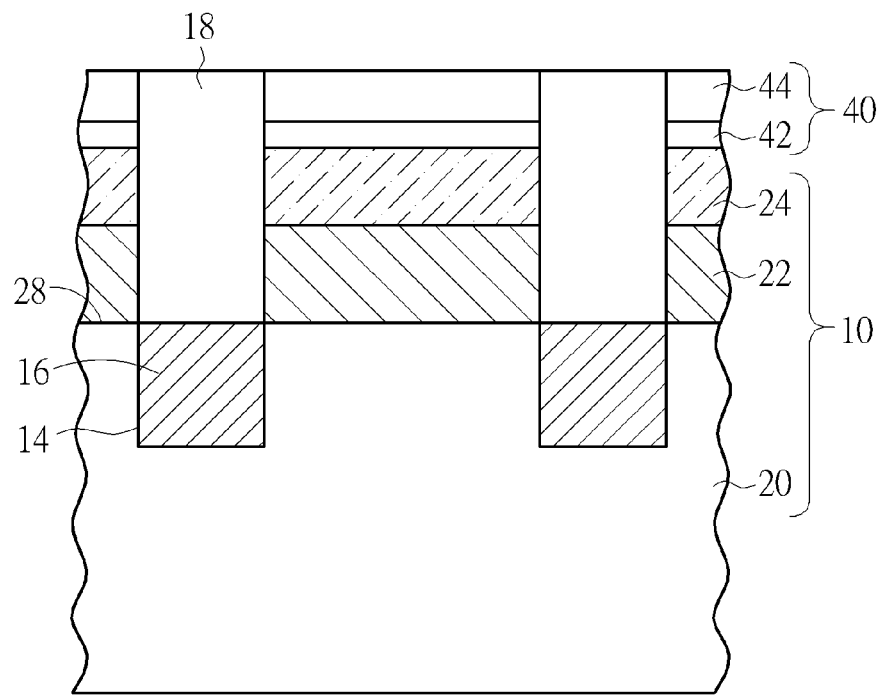

Thereafter, as shown in FIG. 9, a dielectric layer 18 is formed on the silicon layer 16 within the deep trench 14. The dielectric layer 18 may be formed in a way as follows. For example, a dielectric layer may be deposited within the deep trench 14 to fully fill the deep trench 14. The dielectric layer may include for example a dielectric material suitable for a shallow trench structure. The dielectric layer is allowed to extend onto the pad silicon nitride 44 and planarized by a planarization process, such as a CMP process stopping at the hard mask 40, i.e. stopping at the pad silicon nitride 44, giving the dielectric layer 18 having a planarized surface.

FIGS. 7 to 9 show that the deep trench 14 has a width the same as or greater than the width of the shallow trench isolation layer, and accordingly the shallow trench isolation layer is not shown. Or, in other situation, the shallow trench isolation layer is not formed in advance.

Figure 10:
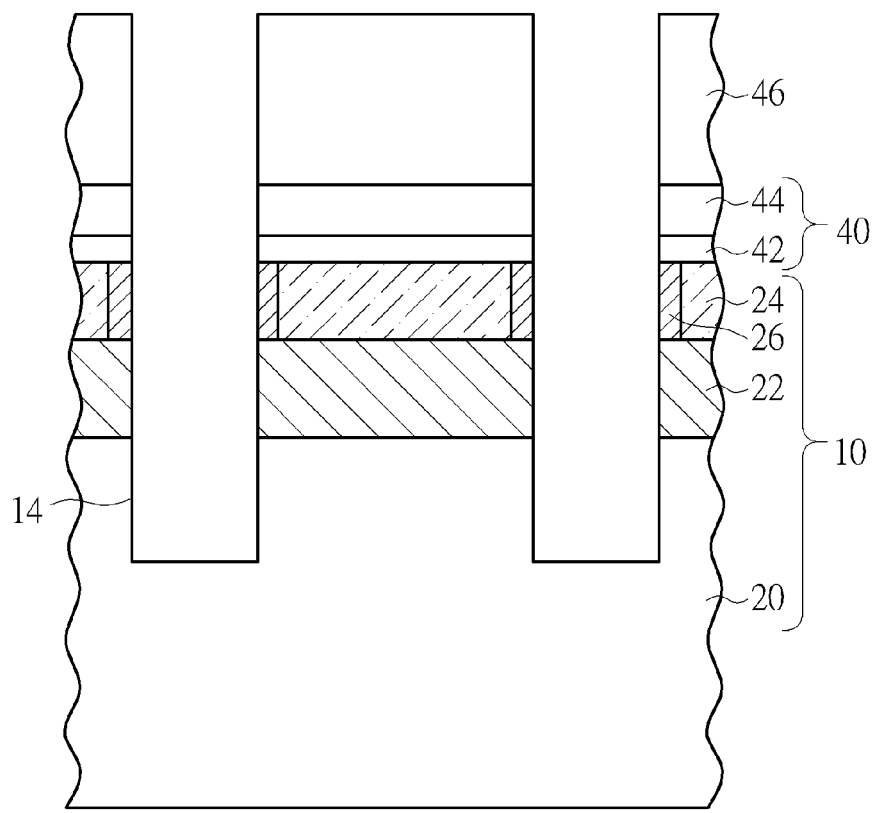
FIG. 10 is a cross-sectional view illustrating a method of forming a structure having harmonic effect suppression properties according to another embodiment of the present invention.

FIG. 10 shows another embodiment, in which the shallow trench isolation layer 26 is formed in advance in the surface semiconductor layer 24 of the semiconductor substrate 10. The deep trench 14 is obtained by etch through the hard mask 40 and passes through the shallow trench isolation layer 26 and the buried dielectric 22 and goes into the base semiconductor substrate 20.

Figure 11:
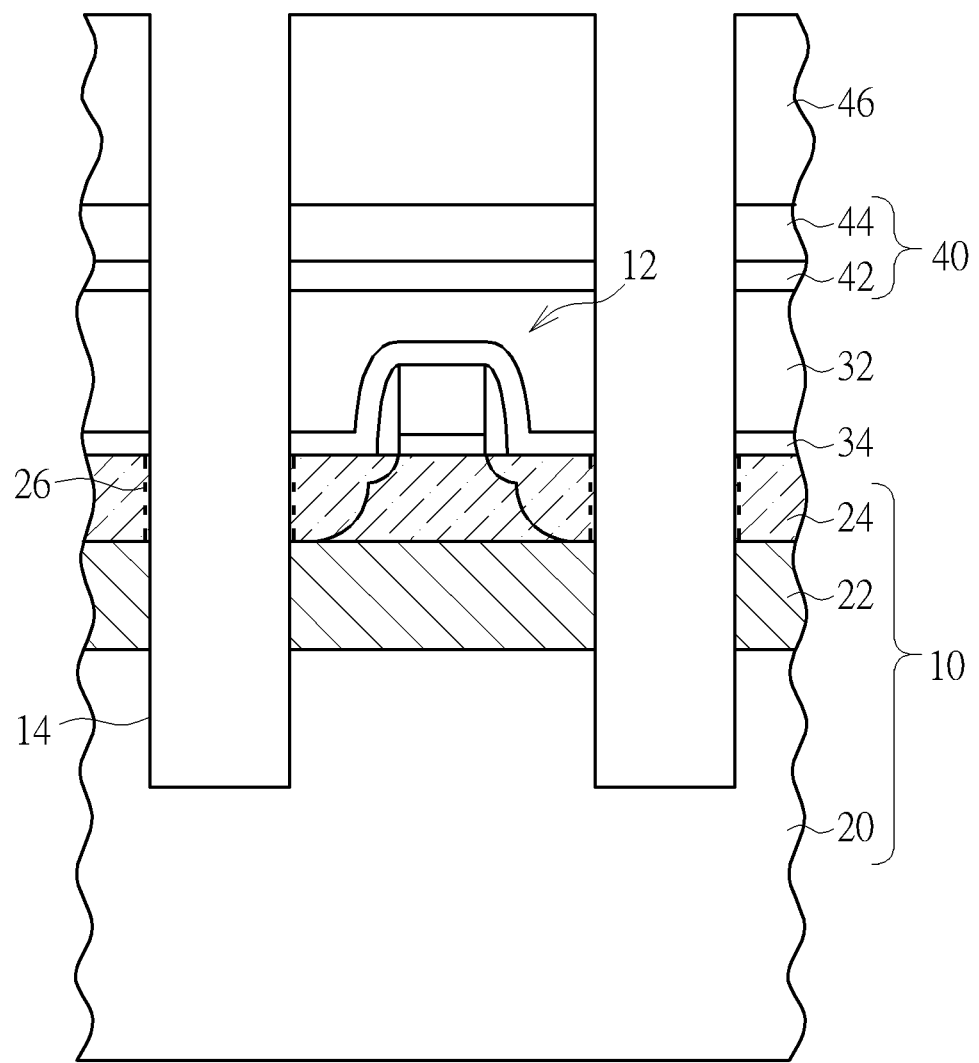
FIG. 11 is a cross-sectional view illustrating a method of forming a structure having harmonic effect suppression properties according to further another embodiment of the present invention.

In another aspect of the present invention, in a method of forming a harmonic-effect-suppression structure according to still another embodiment, the deep trench is formed after the interlayer dielectric is formed. Referring to FIG. 11, first, the semiconductor substrate 10 and the device 12 on or in the semiconductor substrate 10 are provided. The semiconductor substrate 10 includes the base semiconductor substrate 20, the buried dielectric 22 on the base semiconductor substrate 20, the surface semiconductor layer 24 on the buried dielectric 22, and the shallow trench isolation layer 26 in the surface semiconductor layer. Next, the interlayer dielectric 32 is formed to cover the semiconductor substrate 10, including the device 12. Thereafter, the deep trench 14 is formed. The deep trench 14 is allowed to be adjacent to the device 12 and extends through the interlayer dielectric 32, the shallow trench isolation layer 26, and the buried dielectric 22 and into the base semiconductor substrate 20. The deep trench 14 is aligned with the shallow trench isolation layer 26. In other words, the deep trench 14 and the shallow trench isolation layer 26 have sidewalls substantially overlapping each other.

In this embodiment, the deep trench 14 may be formed in a way similar to the steps described above, for example, forming a hard mask 40 on the interlayer dielectric 32, etching the interlayer dielectric 32, the shallow trench isolation layer 26, the buried dielectric 22, and the base semiconductor substrate 20 through the hard mask 40 to form the deep trench 14. Thereafter, similar to the aforesaid embodiment, the silicon layer 16 and the dielectric layer 18 are formed using the hard mask 40. Alternatively, it can be different from the aforesaid embodiment to remove the hard mask 40 and to use the interlayer dielectric as a stop layer for the planarization process. For example, the silicon layer may be formed in the way in which, a silicon layer fully fills the deep trench 14 and extends onto the interlayer dielectric 32; and a planarization process, such as a CMP process, is performed and stops at the interlayer dielectric 32, so as to make the silicon layer have a planar surface. Thereafter, the silicon layer is etched back to have a desired thickness. The dielectric layer can be formed by for example filling the deep trench 14 with a dielectric layer which may include a dielectric material suitable for shallow trench isolation. The dielectric layer is allowed to extend onto the interlayer dielectric 32. Thereafter, a planarization process, such as CMP, is performed to together planarize the interlayer dielectric 32 and the dielectric layer. The dielectric layer is allowed to contact the silicon layer and a portion of the base semiconductor substrate. Accordingly, the silicon layer and the base semiconductor substrate are electrically isolated from each other.

In the methods described above, it is noted that after the silicon layer is formed, such as the silicon layer 16 shown in FIG. 8, the surface of the silicon layer may be ion-implanted in advance and then the dielectric layer is formed thereon. Alternatively, before the silicon layer is formed, such as the silicon layer 16 shown in FIG. 7 and FIG. 11, the bottom of the deep trench 14, i.e. the surface of the base semiconductor substrate 20 may be ion-implanted in advance. The implanted ions may include for example proton or inert gas ion including for example argon ions, krypton ions, nitrogen ions, xenon ions, neon ions, carbon ions, oxygen ions or the like. The implantation dosage may be for example $10^{14}$ to $10^{16}$ cm$^{-2}$. The surface of the base semiconductor substrate 20 includes the portion forming the bottom surface and the sidewall of the deep trench 14. It is preferred that the surface of the base semiconductor substrate 20, i.e. the bottom of the deep trench 14, is ion-implanted in advance, such that the dosage can be relatively high.

Furthermore, it is noted that the silicon layer may include polysilicon, and, after the silicon layer is formed the polysilicon may be ion-implanted to become amorphized, so as to increase more charge-trapping locations in the silicon layer.

Furthermore, during formation of the deep trench 14, an anisotropic etch process may be employed, so as to make the deep trench 14 have a substantially continuous sidewall. Or, during formation of the deep trench 14, an anisotropic etch process may be performed first and subsequently an isotropic etch process is performed, so as to make a lower portion of the deep trench 14 have a bowl-shaped sidewall in a cross-sectional view. The isotropic etch process may include for example a dry-type plasma etch or a wet etch using an HF etchant or dilute HF etchant. Or, during formation of the deep trench 14, an anisotropic etch process is performed first, and subsequently an anisotropic etch process is performed for example using an etchant solution having tetramethylammonium hydroxide (TMAH) or potassium hydroxide (KOH) ingredient to etch the silicon layer. By virtue of different etch rates for different crystallographic planes of the polysilicon layer with respect to such type of etchant solution, it is possible to make a lower portion of the deep trench 14 have a polygon-shaped sidewall in a cross-sectional view. The polygon shape may be for example a shape similar to diamond or rhombus. Furthermore, after the deep trench 14 is formed, a layer of dielectric material may be formed on the sidewall of the deep trench 14. The dielectric material may include silicon oxide, silicon oxynitride, or silicon nitride. The dielectric material may protect the surface semiconductor layer, such as silicon layer, of the sidewall of the deep trench from being etched.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a harmonic-effect-suppression structure, comprising:
   providing a semiconductor substrate comprising:
      a base semiconductor substrate,
      a buried dielectric on the base semiconductor substrate,
      a surface semiconductor layer on the buried dielectric, and
      a shallow trench isolation layer in the surface semiconductor layer;
   forming a deep trench extending through the surface semiconductor layer and the buried dielectric into the base semiconductor substrate;
   forming a silicon layer within a lower portion of the deep trench, the silicon layer allowed to have a top surface height substantially the same as or lower than a top surface height of the base semiconductor substrate; and
   forming a dielectric layer within the deep trench and on the silicon layer, wherein the top surface of the shallow trench isolation layer is even with the top surface of the dielectric layer filled in the deep trench.

2. The method according to claim 1, further, after forming the silicon layer, comprising performing an ion implantation process on a surface of the silicon layer.

3. The method according to claim 1, further, before forming the silicon layer, comprising performing an ion implantation process on a surface of the base semiconductor substrate as a bottom of the deep trench silicon layer.

4. The method according to claim 1, wherein, the silicon layer comprises polysilicon, and after forming the silicon layer, an ion implantation process is performed on the polysilicon to allow the polysilicon to become amorphous.

5. The method according to claim 1, wherein, forming the deep trench comprises performing an anisotropic etch process to allow the deep trench to have a substantially continuous sidewall.

6. The method according to claim 1, wherein, forming the deep trench comprises performing an anisotropic etch process followed by an isotropic etch process to allow a lower portion of the deep trench to have a shape of bowl from a cross-sectional view.

7. The method according to claim 1, wherein, forming the deep trench comprises:
   forming a hard mask having a pattern on the surface semiconductor layer;
   etching the surface semiconductor layer, the buried dielectric, and the base semiconductor substrate through the hard mask to form the deep trench; and
   removing the hard mask.

8. The method according to claim 7, wherein, forming the silicon layer comprises:
   before removing the hard mask, performing a blanket deposition to fill the deep trench with silicon, performing a chemical-mechanical polishing process stopping at the hard mask, and etching back the silicon layer.

9. The method according to claim 8, wherein, forming the dielectric layer comprises:
   before removing the hard mask, performing a deposition process to form a shallow trench isolation dielectric layer to fill the deep trench, and performing a chemical-mechanical polishing process stopping at the hard mask layer.

10. A method of forming a harmonic-effect-suppression structure, comprising:
    providing a semiconductor substrate and a device formed on or in the semiconductor substrate, the semiconductor substrate comprising:
       a base semiconductor substrate,
       a buried dielectric on the base semiconductor substrate,
       a surface semiconductor layer on the buried dielectric, and
       a shallow trench isolation layer in the surface semiconductor layer;
    forming an interlayer dielectric covering the semiconductor substrate;
    forming a deep trench adjacent to said device and extending through the interlayer dielectric, said shallow trench isolation layer and the buried dielectric into the base semiconductor substrate, wherein the deep trench is aligned to the shallow trench isolation layer;
    forming a silicon layer within a lower portion of the deep trench, the silicon layer allowed to have a top surface height substantially the same as or lower than a top surface height of the base semiconductor substrate; and
    forming a dielectric layer within the deep trench, wherein the dielectric layer is in contact with the silicon layer and a portion of the base semiconductor substrate and the top surface of the shallow trench isolation layer is even with the top surface of the dielectric layer filled in the deep trench.

11. The method according to claim 10, further, after forming the silicon layer, comprising performing an ion implantation process on a surface of the silicon layer.

12. The method according to claim 10, further, before forming the silicon layer, comprising performing an ion implantation process on a surface of the base semiconductor substrate as a bottom of the deep trench silicon layer.

13. The method according to claim 10, wherein, the silicon layer comprises polysilicon, and after forming the silicon layer, an ion implantation process is performed on the polysilicon to allow the polysilicon to become amorphous.

14. The method according to claim 10, wherein, forming the deep trench comprises performing an anisotropic etch process to allow the deep trench to have a substantially continuous sidewall.

15. The method according to claim 10, wherein, forming the deep trench comprises performing an anisotropic etch process followed by an isotropic etch process to allow a lower portion of the deep trench to have a shape of bowl from a cross-sectional view.

16. The method according to claim 10, wherein, forming the deep trench comprises:
   forming a hard mask having a pattern on the interlayer dielectric;
   etching the surface semiconductor layer, the buried dielectric, and the base semiconductor substrate through the hard mask to form the deep trench; and
   removing the hard mask layer.

17. The method according to claim 16, wherein, forming the silicon layer comprises:
   performing a blanket deposition to fill the deep trench with silicon;
   performing a chemical-mechanical polishing process stopping at the interlayer dielectric; and
   etching back the silicon layer.

18. The method according to claim 17, wherein, forming the dielectric layer comprises:
   performing a deposition process to forma shallow trench isolation dielectric layer to fill the deep trench; and
   performing a chemical-mechanical polishing process to planarize a top surface of the STI dielectric layer.

\* \* \* \* \*